(12) United States Patent
McCollum

(10) Patent No.: US 7,486,538 B2
(45) Date of Patent: *Feb. 3, 2009

(54) RADIATION TOLERANT SRAM BIT

(75) Inventor: John L. McCollum, Saratoga, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/045,424

(22) Filed: Mar. 10, 2008

(65) Prior Publication Data

US 2008/0151595 A1     Jun. 26, 2008

Related U.S. Application Data

(63) Continuation of application No. 11/676,188, filed on Feb. 16, 2007, now Pat. No. 7,366,008, which is a continuation of application No. 10/752,222, filed on Jan. 5, 2004, now Pat. No. 7,193,885.

(51) Int. Cl.
    *G11C 11/00* (2006.01)
(52) U.S. Cl. .................. 365/148; 365/100; 365/154; 365/189.04; 365/189.14
(58) Field of Classification Search ............ 465/148, 465/100, 154, 189.04, 189.14
See application file for complete search history.

(56) References Cited

U.S. PATENT DOCUMENTS 5,206,533 A    4/1993   Houston
5,311,070 A *   5/1994   Dooley ....................... 327/208
5,581,198 A    12/1996   Trimberger
6,111,780 A    8/2000   Bertin
6,147,899 A    11/2000   Chan (Continued)

FOREIGN PATENT DOCUMENTS

WO      99/34368 A1    7/1999

(Continued)

OTHER PUBLICATIONS

Notification of Transmittal of the International Search Report and the Written Opinion of the International Searching Authority of corresponding International Patent Application PCT/US04/43631, dated May 10, 2006, 8 pages.

(Continued)

*Primary Examiner*—Thong Q Le
(74) *Attorney, Agent, or Firm*—Lewis and Roca LLP

(57) ABSTRACT

In an integrated circuit, a radiation tolerant static random access memory device comprising a first inverter having an input and an output, a second inverter having an input and an output. A first resistor is coupled between the output of the first inverter and the input of the second inverter. A second resistor is coupled between the output of the second inverter and the input of the first inverter. A first write transistor is coupled to the output of the first inverter and has a gate coupled to a source of a first set of write-control signals and a second write transistor is coupled to the output of the second inverter and has a gate coupled to said source of a second set of write-control signals. Finally, a pass transistor has a gate coupled to the output of on of the first and second inverters.

9 Claims, 4 Drawing Sheets

U.S. PATENT DOCUMENTS

| | | | |
|---|---|---|---|
| 6,271,568 B1 * | 8/2001 | Woodruff et al. | 365/154 |
| 6,324,102 B1 | 11/2001 | McCollum | |
| 6,388,927 B1 | 5/2002 | Churchill et al. | |
| 6,822,894 B1 | 11/2004 | Costello et al. | |
| 7,193,885 B2 * | 3/2007 | McCollum | 365/154 |
| 7,366,008 B2 * | 4/2008 | McCollum | 365/154 |

FOREIGN PATENT DOCUMENTS

WO     03/090229 A2     10/2003

OTHER PUBLICATIONS

European Supplemental Search Report of corresponding European Patent Application No. 04815653.3 dated Jun. 15, 2007, 3 pages.

* cited by examiner

RADIATION TOLERANT SRAM BIT

CROSS-REFERENCE TO RELATED APPLICATIONS

This application is a continuation of U.S. patent application Ser. No. 11/676,188, filed Feb. 16, 2007, which is a continuation of U.S. patent application Ser. No. 10/752,222, filed Jan. 5, 2004, now issued as U.S. Pat. No. 7,193,885, the entirety of which is incorporated by reference herein.

BACKGROUND OF THE SYSTEM

1. Field of the System

The present system relates to integrated circuit devices. More specifically, the system relates to field programmable gate array (FPGA) integrated circuits employing static random access memory (SRAM) devices as the programming medium and to providing radiation tolerant SRAM FPGA integrated circuits.

2. Background

FPGA integrated circuits are well known in the art. The programming mechanisms for FPGA devices include anti-fuses, static random access memory (SRAM) devices and flash memory. SRAM based FPGA integrated circuits usually comprise a SRAM bit having write transistors driving a pass transistor that is used to switch a signal path as part of the configuration of the FPGA integrated circuit. The SRAM bit is used to drive the gate of a pass transistor programming switch that selectively interconnects desired circuit nodes.

Electronic equipment, notably memories, such as static random access memories, is often used in environments where they are or may be subjected to high-energy particles. They may also be subjected to a high-energy electromagnetic pulse field. Such particles may include alpha, beta, gamma and other particles, which have sufficient energy to pass through the outer surface of a case and impact the memory cell itself.

Outer space is one environment in which a memory cell would be subjected to impact from a high-energy particle. When the sun has an energy eruption, which occurs with increasing frequency and intensity during high activity sunspot cycles, the likelihood of impact of a high-energy particle on objects orbiting the earth becomes extremely high. Other environments, such as resulting from a nuclear strike may also produce high-energy particles or a high-energy electromagnetic pulse (EMP).

Many integrated circuits in use today have a reversed biased PN junction that will be shorted due to charges generated by a high-energy particle hit. If this happens to a standard memory cell, the logic state of the cell becomes unknown. It may be inverted, or the data may be erased.

As stated above, when these prior art SRAM-based integrated circuit devices are subjected to environmental radiation, the charge on the SRAM bit may be flipped by the radiation. As is known to those of ordinary skill in the art, if the programming charge stored in the SRAM bit is flipped by exposure to radiation, the state of the switching transistor cannot be guaranteed. When a SRAM bit has its logic state flipped, i.e. from a 1 to a 0 or a 0 to a 1, it may cause the logic cell associated with the SRAM bit to change its function or it could cause a change in the routing connections. For example, a flipped SRAM bit could potentially cause two outputs to be coupled together, which could cause multiple problems in an FPGA including failure due to overheating.

Accordingly, current memory cells must either be protected from the high-energy particle hit by, for example, shielding, or designed in such a way that they are resistant to a change in data state even if hit by a high energy particle or exposed to a high energy EMP. Current memory cells are designed using special circuit techniques that increase the stability of flip-flops and require the addition to the circuit of a register or require much larger circuit designs.

Hence, what is needed is a memory cell designed specifically for an FPGA that is written on start up. What is also needed is a memory cell that does not require a large circuit design.

SUMMARY OF THE SYSTEM

The present system comprises a radiation tolerant static random access memory device comprising a first inverter having an input and an output, and a second inverter having an input and an output. A resistor is coupled between the output of the first inverter and the input of the second inverter. A pass transistor has a gate coupled to an output of either the first or second inverter.

A better understanding of the features and advantages of the invention will be obtained by reference to the following detailed description of the invention and accompanying drawings that set forth an illustrative embodiment in which the principles of the invention are utilized.

DETAILED DESCRIPTION OF THE DRAWINGS

Those of ordinary skill in the art will realize that the following description of the invention is illustrative only and not in any way limiting. Other embodiments of the invention will readily suggest themselves to such skilled persons.

A SRAM device used mainly in the read state such as configuration RAM in an FPGA can be hardened against radiation effects ("radiation hardened") to a very high level by adding a large value resistor. A SRAM device used mainly in the read state is usually written only once on power-up to define the function of the integrated circuit, and in most applications it is never changed after power up.

Figure 1:
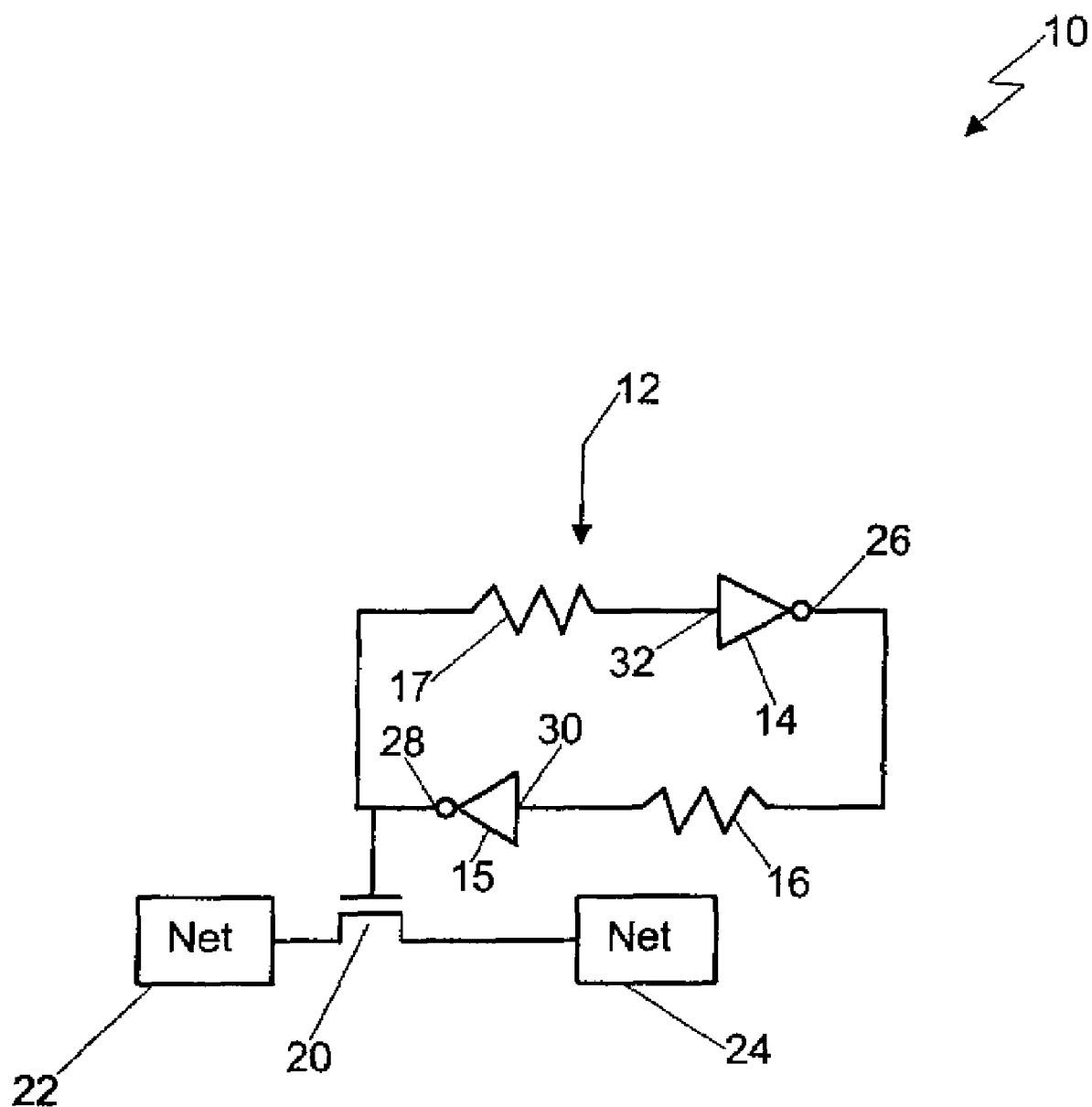
FIG. 1 is a simplified schematic diagram of one embodiment of a SRAM device of the invention.

FIG. 1 is a simplified schematic diagram of one embodiment of radiation tolerant SRAM circuit 10 of the invention. SRAM circuit device 12 drives a pass transistor 20 that is used to switch a signal path between two nets 22 and 24. When pass transistor 20 is turned on by SRAM device 12, i.e. when the state of SRAM device 12 is 1, nets 22 and 24 are connected and signal is free to flow through the nets. In the present disclosure "nets" are defined as logic arrays including routing architecture, logic modules, flip-flops and many other various components used in FPGA logic circuits. It may be noted that in certain cases, the state of SRAM device may be 0, and in this case, pass transistor would be off and nets 22 and 24 would not be connected.

In this disclosure, various circuits and logical functions are described. It is to be understood that designations such as "1"

and "0" in these descriptions are arbitrary logical designations. In a first implementation of the invention, "1" may correspond to a voltage high, while "0" corresponds to a voltage low or ground, while in a second implementation, "0" may correspond to a voltage high, while "1" corresponds to a voltage low or ground. Likewise, where signals are described, a "signal" as used in this disclosure may represent the application, or pulling "high" of a voltage to a node in a circuit where there was low or no voltage before, or it may represent the termination, or the bringing "low" of a voltage to the node, depending on the particular implementation of the invention.

FIG. 1 is a simplified schematic diagram of one embodiment of a SRAM device of the invention. FIG. 1 illustrates a SRAM circuit 10 having two inverters 14 and 15. Inverter 14 has an output 26 coupled to an input 30 of inverter 15 through resistor 16. Inverter 15 has an output 28 coupled to the input 32 of inverter 14. The gates of inverter 15 are connected directly to resistor 16, so no junction appears at input 30 to collect any charge from an ion passing through the circuit. Hence, any ion hit would only appear as current on the side of the resistor connected to the inverter. In order to flip the state, the charge generated by the radiation hit must charge the gates of inverters 14 and 15. As is well known to those of ordinary skill in the art, the gates of inverters 14 and 15 have a large RC constant due to the addition of resistor 16. In an embodiment such as FIG. 1 having one resistor, the value of the resistor would have to be approximately 4 mega ohms. As would be apparent to one of ordinary skill in the art, the exact value of the resistor can be tailored to the desired radiation hardness by available simulation. For example, a 3D bulk silicon simulator that simulates a charge track pulse (ion hit) that combines with SPICE to simulate the effect on the circuit (called mixed mode).

The formula for the RC time constant is as follows:

$$\tau = RC$$

where $\tau$ is the time constant for the circuit, R is the total equivalent resistance of the circuit, and C is the total equivalent capacitance of the circuit. When a capacitor charges or discharges through a resistance, certain time is required for the capacitor to charge fully or discharge fully. The voltage across a capacitor cannot change instantaneously because a finite time is required to move the charge from one point to another.

The current depends on the amount of charge moved in a given time. When the resistance is increased, the charging current is reduced, thus increasing the charging time of the capacitor. When the capacitance is increased, the amount of charge increases; thus, for the same current more time is required to charge the capacitor.

In the invention, as long as the RC time constant of the memory cell circuit exceeds the recovery time (the time it takes for the signal to reach the input of the inverter after the inverter is hit by a charged particle) of the output of the inverter, the bit cannot be flipped by radiation. The write time for SRAM device 12 will exceed the RC time constant because of the addition of the large resistors. In the present circuit, the capacitance consists primarily of the gate capacitance of the associated inverter plus some interconnect capacitance.

In one example, for illustrative purposes only, if the recovery time is 10 nS and the inverter input capacitance is 5 fFm then the resistor should be about 2 mega ohms. In another example, set forth below, two resistors may be used. However, the value of each resistor should be about 1 mega ohm each to mirror the circuit above. As will be clear to those of ordinary skill in the art having the benefit of this disclosure, the exact value of the resistor may be tailored to the desired radiation hardness by available simulation tools. The invention typically uses resistors with a resistance greater than 1 mega ohm.

Figure 2:
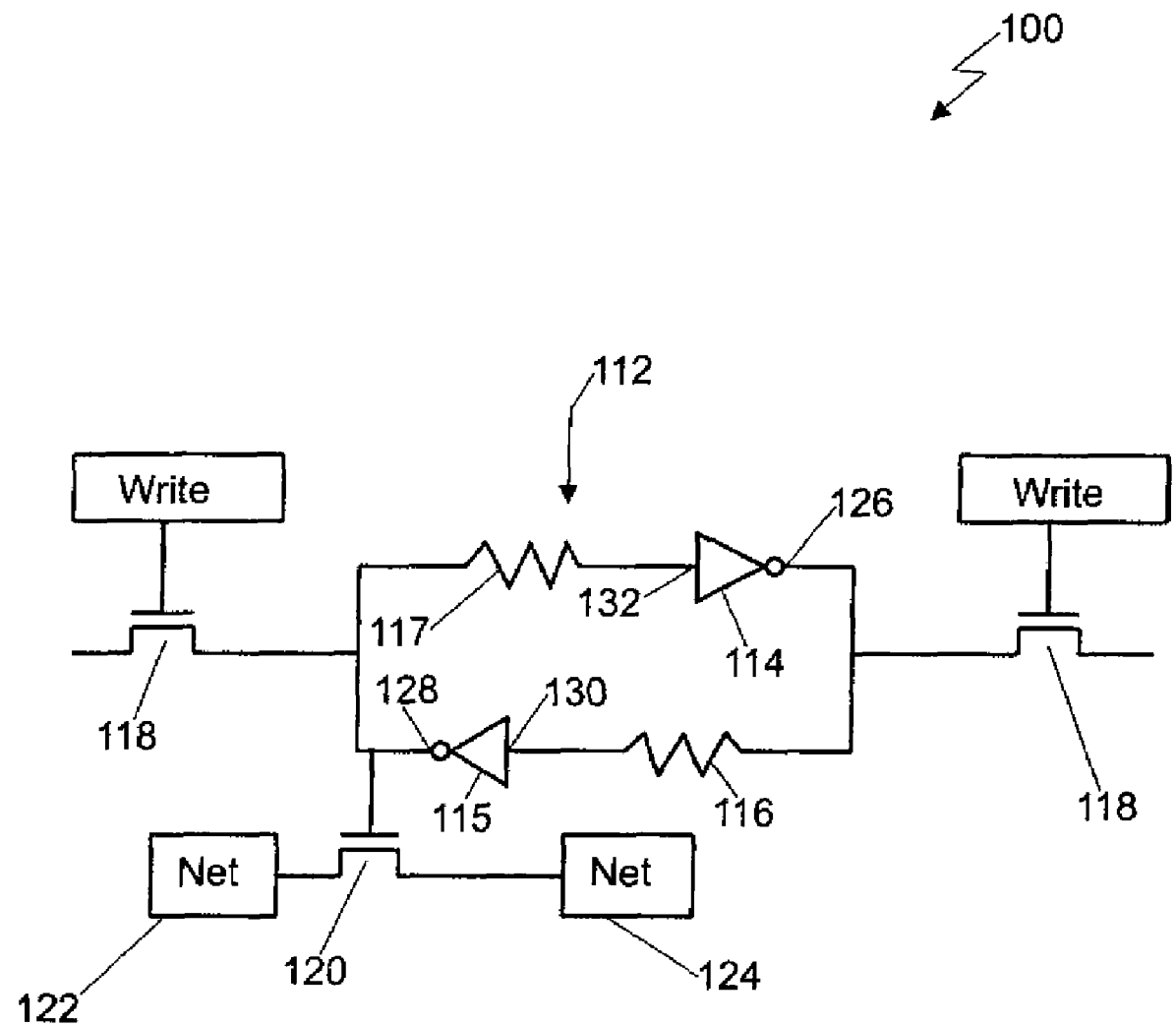
FIG. 2 is a simplified schematic diagram of another embodiment of a SRAM device of the invention.

FIG. 2 is a simplified schematic diagram of another embodiment of a radiation tolerant SRAM device 100 of the invention. Radiation tolerant SRAM device 100 comprises SRAM device 112 that may have at least one, in this example two, write transistors 118. SRAM device 112 drives a pass transistor 120 which is used to switch a signal path between two nets 122 and 124. When pass transistor is turned on by SRAM device 112, i.e. when the state of SRAM device 112 is 1, nets 122 and 124 are connected and signal is free to flow through the nets. It may be noted that in certain cases, the state of SRAM device may be 0, and in this case, pass transistor would be off and nets 122 and 124 would not be connected.

Figure 3:
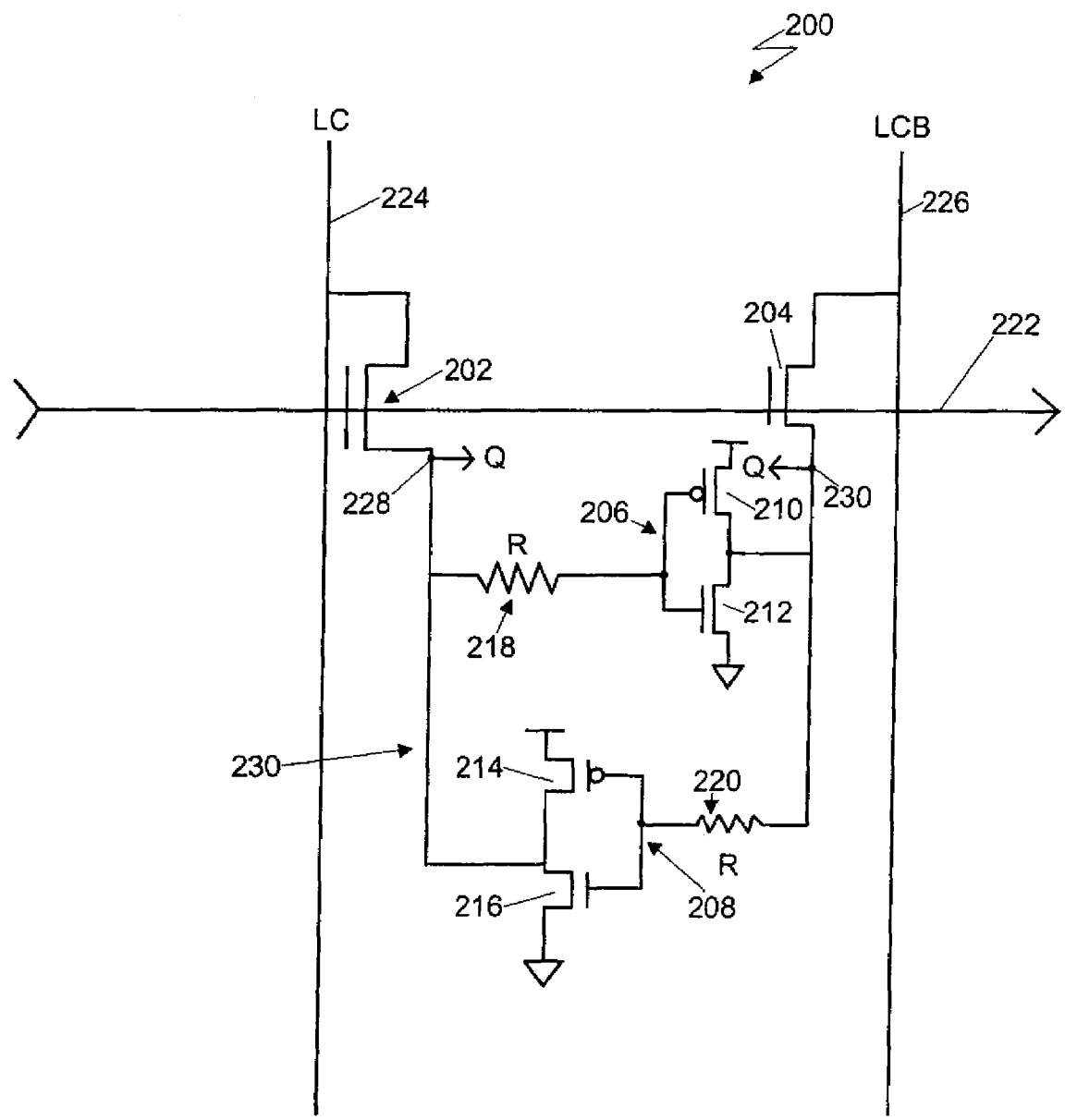
FIG. 3 is a simplified schematic diagram showing yet another embodiment of a circuit having a SRAM device of the invention.

FIG. 3 is a simplified schematic diagram showing yet another embodiment of a circuit 200 having a SRAM bit of the invention. The circuit 200 consists of six transistors distributed as two n-channel pass transistors 202 and 204, and two CMOS inverters 206 and 208 each consisting of a P-channel transistor 210 and 214 and an N-channel transistor 212 and 216. Inverters 206 and 208 are coupled through two poly-resistors 218 and 220 to form a latch. Resistors 218 and 220 isolate the input of each inverter 206 and 208 from the output of the other. Memory circuit 200 can be written by means of pass transistors 202 and 204, word line 222 and bit lines 224 and 226. To write, bit lines are 224 and 226 are driven to the values desired for Q and QB nodes 228 and 230 respectively and word line 222 is driven high. This forces the values on bit lines 224 and 226 into SRAM bit 230. To read, the bit lines 224 and 226 are precharged to Vcc and word line 222 is driven high. In one embodiment, there should be no diffusion region between resistor 218 and inverter 206, and no diffusion region between resistor 220 and inverter 208, otherwise the diffusion regions collect charge.

In this disclosure, various circuits and logical functions are described. It is to be understood that designations such as "Vcc" or "1" and "ground" or "0" in these descriptions are arbitrary logical designations. In a first implementation of the invention, "Vcc" or "1" may correspond to a voltage high, while "ground" or "0" corresponds to a voltage low or ground, while in a second implementation, "ground" or "0" may correspond to a voltage high, while "Vcc" or "1" corresponds to a voltage low or ground. Likewise, where signals are described, a "signal" as used in this disclosure may represent the application, or pulling "high" of a voltage to a node in a circuit where there was low or no voltage before, or it may represent the termination, or the bringing "low" of a voltage to the node, depending on the particular implementation of the invention.

SRAM bit 230 then pulls either bit line 224 or 226 low depending on the data stored in SRAM bit 230 and the voltage on bit lines 224 and 226 is sensed. Resistors 218 and 220 only slow down the write time, which is the time it takes to initially write the FPGA device. Because typical FPGAs are written only once during each operation period (i.e., during startup), it is acceptable to have a longer write time, due to the large capacitance, that makes the FPGA more radiation tolerant. The propagation delay from the output of one inverter to the input of the second inverter is determined by the RC time constant as stated previously.

Figure 4:
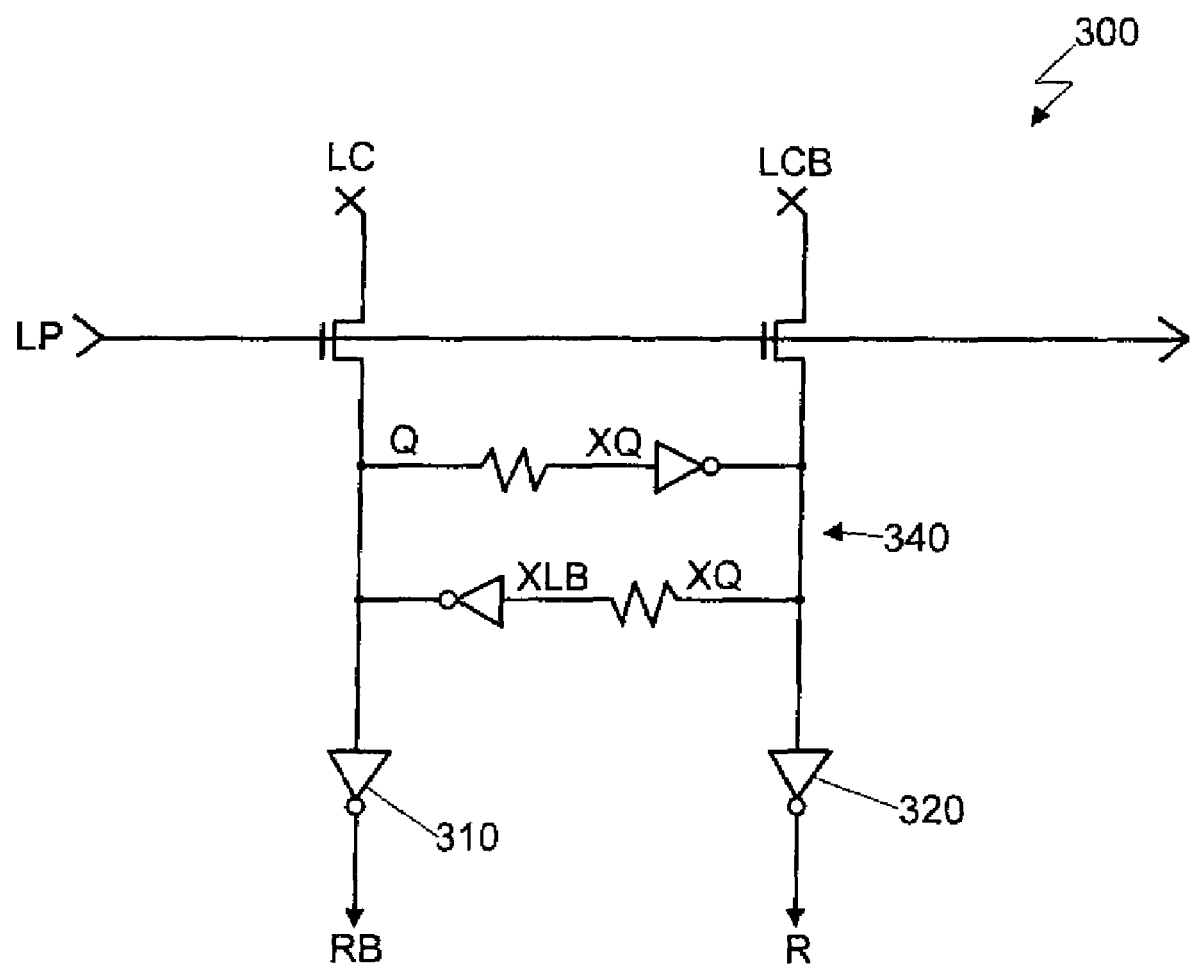
FIG. 4 is a simplified schematic diagram showing yet another embodiment of a circuit having a SRAM device of the invention.

FIG. 4 is a simplified schematic diagram showing a memory circuit 300 having yet another embodiment of SRAM bit 340 of the invention. In this embodiment, two additional inverters 310 and 320 are added to buffer and isolate the data contained in the cell for purposes of programming the FPGA.

It should be understood that various alternatives to the embodiments of the disclosed method and apparatus described herein may be employed in practicing the disclosed method and using the disclosed apparatus. It is intended that the following claims define the scope of the disclosed method and apparatus and that methods and structures within the scope of these claims and their equivalents be covered thereby.

The invention claimed is:

1. A field programmable gate array (FPGA) comprising:
a radiation tolerant static random access memory device comprising:
  a first inverter having an input and an output;
  a second inverter having an input and an output, said output of said first inverter coupled to said input of said second inverter and said output of said second inverter coupled to said input of said first inverter;
  a resistor coupled between said first and second inverter; and
  a pass transistor having a gate coupled to one of said first inverter output and said second inverter output,
wherein:
  an RC time constant of the static random access memory device exceeds a selected recovery time of the static random access memory device; and
  the pass transistor provides field programmability for the FPGA under control of the static random access memory device.

2. The FPGA in claim 1 wherein:
the resistor has a resistance of approximately 4 M ohms.

3. The FPGA in claim 1 wherein:
the selected recovery time is long enough to negate the effect of a high-energy particle impact on the static random access memory device.

4. The FPGA in claim 1 wherein the radiation tolerant static random access memory device further comprises:
  a first write transistor coupled to said output of said first inverter and having a gate coupled to a source of write-control signals; and
  a second write transistor coupled to said output of said second inverter and having a gate coupled to said source of write-control signals.

5. A field programmable gate array (FPGA) comprising:
a radiation tolerant static random access memory device comprising:
  a first inverter having an input and an output;
  a second inverter having an input and an output;
  a first resistor coupled between said output of said first inverter and said input of said second inverter;
  a second resistor coupled between said output of said second inverter and said input of said first inverter;
  a first write transistor coupled to said output of said first inverter and having a gate coupled to a source of write-control signals;
  a second write transistor coupled to said output of said second inverter and having a gate coupled to said source of write-control signals; and
  a pass transistor having a gate coupled to said output of one of said first and second inverters.

6. A field programmable gate array (FPGA) according to claim 5 wherein:
said first and second inverters comprise a plurality of pass transistors.

7. In a field programmable gate array (FPGA), a method of producing a radiation tolerant static random access memory device comprising:
  providing a first inverter having an input and an output;
  coupling a second inverter having an input and an output to said output of said first inverter to said input of said second inverter and coupling said output of said second inverter to said input of said first inverter;
  coupling a resistor between said first and second inverter;
  coupling a pass transistor gate to one of said first inverter output and said second inverter output;
  coupling a first write transistor to said output of said first inverter and coupling a gate to a source of write-control signals; and
  coupling a second write transistor to said output of said second inverter and coupling a gate to said source of write-control signals.

8. In a field programmable gate array (FPGA), a method of producing a radiation tolerant static random access memory device comprising:
  providing a first inverter having an input and an output;
  providing a second inverter having an input and an output;
  coupling a first resistor between said output of said first inverter and said input of said second inverter;
  coupling a second resistor between said output of said second inverter and said input of said first inverter;
  coupling a first write transistor coupled to said output of said first inverter and coupling a gate of said first write transistor to a source of write-control signals;
  coupling a second write transistor coupled to said output of said second inverter and coupling a gate of said second write transistor to said source of write-control signals; and
  coupling a pass transistor having a gate to one of said first inverter output and said second inverter output.

9. A method of producing a radiation tolerant field programmable gate array (FPGA) according to claim 8 wherein:
said first and second inverters comprise a plurality of pass transistors.

* * * * *